(12) United States Patent
Kihara

(10) Patent No.: US 8,941,213 B2
(45) Date of Patent: Jan. 27, 2015

(54) SEMICONDUCTOR DEVICE

(71) Applicant: Renesas Electronics Corporation, Kawasaki (JP)

(72) Inventor: Takao Kihara, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/865,869

(22) Filed: Apr. 18, 2013

(65) Prior Publication Data

US 2013/0285198 A1  Oct. 31, 2013

(30) Foreign Application Priority Data

Apr. 25, 2012  (JP) ................. 2012-099687

(51) Int. Cl.
*H01L 29/00* (2006.01)
*H01L 49/02* (2006.01)
*H01L 23/522* (2006.01)
*H01F 17/00* (2006.01)

(52) U.S. Cl.
CPC .......... *H01L 28/10* (2013.01); *H01L 23/5227* (2013.01); *H01F 17/0013* (2013.01); *H01F 2017/0073* (2013.01); *H01F 2017/0086* (2013.01); *Y10S 257/924* (2013.01)
USPC ............ 257/531; 257/E29.139; 257/E21.022; 257/924; 257/528; 438/381

(58) Field of Classification Search
USPC .......... 257/531, 528, 924, E29.139, E21.022; 438/381
See application file for complete search history.

(56) References Cited

U.S. PATENT DOCUMENTS

| 6,825,749 B1 * | 11/2004 | Lin et al. ................. 336/200 |
| 2006/0038621 A1 * | 2/2006 | Shiramizu et al. .......... 331/36 L |
| 2009/0002071 A1 * | 1/2009 | Aoki et al. ..................... 330/269 |

FOREIGN PATENT DOCUMENTS

| JP | 2004-228144 A | 8/2004 |
| JP | 2005-327931 A | 11/2005 |

* cited by examiner

*Primary Examiner* — Matthew Gordon
(74) *Attorney, Agent, or Firm* — McGinn IP Law Group, PLLC

(57) ABSTRACT

A semiconductor device includes: a spiral-shaped inductor formed to include a metal wire; and a horseshoe-shaped inductor formed to include the metal wire. The horseshoe-shaped inductor is arranged such that an opening of the horseshoe-shaped inductor is disposed opposite to the spiral-shaped inductor. Accordingly, unnecessary wave (spurious) output from a transmitting unit can be reduced as small as possible.

14 Claims, 10 Drawing Sheets

(a)

(b)

(a)

(b)

(a)

(b)

SEMICONDUCTOR DEVICE

BACKGROUND OF THE INVENTION

1. Field of the Invention

The present invention relates to a semiconductor device, and is suitably usable for a semiconductor device having a structure capable of reducing unnecessary wave (spurious) of a transmitting unit, for example.

2. Description of the Background Art

Mobile communication devices such as mobile phones, personal digital assistants (PDAs), WiFi® (Wireless Fidelity) transceivers, and other communication devices transmit/receive communication signals in various frequencies.

In particular, in a mobile phone or the like, an LTE (Long Term Evolution)/W-CDMA/GSM® triple mode transceiver or the like has been used.

For efficient communication, transmission and reception signals have frequencies several times higher than baseband information signals that carry information to be communicated. Accordingly, each of such transceivers has to up-convert a transmission signal and down-convert a reception signal using a frequency modulator.

In response to a request for downsizing, such a transceiver is frequently formed as one chip. Accordingly, circuits of the transmitting unit and the receiving unit may cause generation of noise in the receiving unit and the transmitting unit, respectively. In particular, due to an influence of magnetic field generated by current flowing in each circuit, current is induced in the other circuit, disadvantageously. As a technique for preventing such noise, the following techniques have been disclosed.

Japanese Patent Laying-Open No. 2004-228144 (Patent Document 1) has an object to implement a structure capable of suppressing inductors from being deteriorated in properties due to magnetic coupling between the inductors in an array-type coil component including a plurality of coils. In the coil component of the invention disclosed in Japanese Patent Laying-Open No. 2004-228144 (Patent Document 1), a plurality of coils are disposed in a stacked member, which includes insulator layers stacked on each other, such that they are adjacent to each other in a direction perpendicular to the stacking direction. Each of the coils is formed of a linear conductor and has a substantially spiral shape or substantially helical shape. Between adjacent coils, linear conductors close to and opposite to each other have extended lines substantially orthogonally crossing each other on the same surface of the insulator layer.

Japanese Patent Laying-Open No. 2005-327931 (Patent Document 2) has an object to provide an integrated inductor capable of suppressing self-mixing resulting from coupling between integrated inductors, and allowing for simplification of circuit and reduction of chip size and power consumption, as well as a receiving circuit employing such an integrated inductor. In the invention disclosed in Japanese Patent Laying-Open No. 2005-327931 (Patent Document 2), at least two conductor layers are provided on a substrate. First and second inductor units are provided which have helical shapes, are formed of the first conductor layer, and are disposed adjacent to each other. The first and second inductor units are connected to each other such that a direction of current in the first inductor unit is opposite to a direction of current in the second inductor unit. For connection between an external circuit and each of the first and second inductor units, the second conductor layer provides at least two portions crossing the first conductor layer.

In particular, an in-phase component (common mode) of a signal generated from a local oscillator of a receiving unit is leaked to a frequency converter of a transmitting unit, i.e., is leaked to a quadrature modulator, and is mixed with the third harmonic of the transmission wave to result in generation of spurious.

The leakage of the signal generated by the local oscillator of the receiving unit is caused by magnetic coupling between a horseshoe-shaped inductor of the oscillator of the receiving unit and a spiral-shaped inductor of the quadrature modulator.

For example, in the case where a transceiver operates at a Band 1 (transmission frequency: 1920 MHz to 1980 MHz; reception frequency: 2110 MHz to 2170 MHz), this unnecessary wave (spurious) falls to a GPS band (1575.42 MHz=3*1955 MHz−2*2145 MHz; the frequency of the signal generated by the local oscillator of the receiving unit is twice as large as the reception frequency). This causes deterioration of reception sensitivity of a GPS receiver provided on the same substrate, disadvantageously.

In the prior art, Japanese Patent Laying-Open No. 2004-228144 (Patent Document 1), the two inductors are arranged such that their "L-shaped" portions face each other, thereby reducing leakage of a signal between the inductors irrespective of in-phase component or differential component. However, Japanese Patent Laying-Open No. 2004-228144 does not fully contemplate to reduce unnecessary wave (spurious) when the in-phase component (common mode) is leaked to the spiral-shaped inductor.

Meanwhile, in Japanese Patent Laying-Open No. 2005-327931 (Patent Document 2), 8-shaped inductors are used for the local oscillator and a low noise amplifier of the receiving circuit, thereby reducing interference between both the circuits. However, Japanese Patent Laying-Open No. 2005-327931 does not fully contemplate to reduce unnecessary wave (spurious) when the in-phase component (common mode) is leaked to the spiral-shaped inductor.

SUMMARY OF THE INVENTION

An object of one embodiment is to solve the above-described problem and provide a semiconductor device capable of reducing unnecessary wave (spurious) output from a transmitting unit as small as possible.

According to one embodiment, a semiconductor device includes: a first inductor formed to include a first conductor layer and having a spiral shape; and a second inductor formed to include the first conductor layer and having a horseshoe shape, the second inductor being arranged such that an opening of the second inductor is disposed opposite to the first inductor.

According to the above-described one embodiment, unnecessary wave (spurious) output from the transmitting unit can be reduced as small as possible. Accordingly, the number of SAW (Surface Acoustic Wave) filters can be smaller. This leads to reduction of mounting area.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
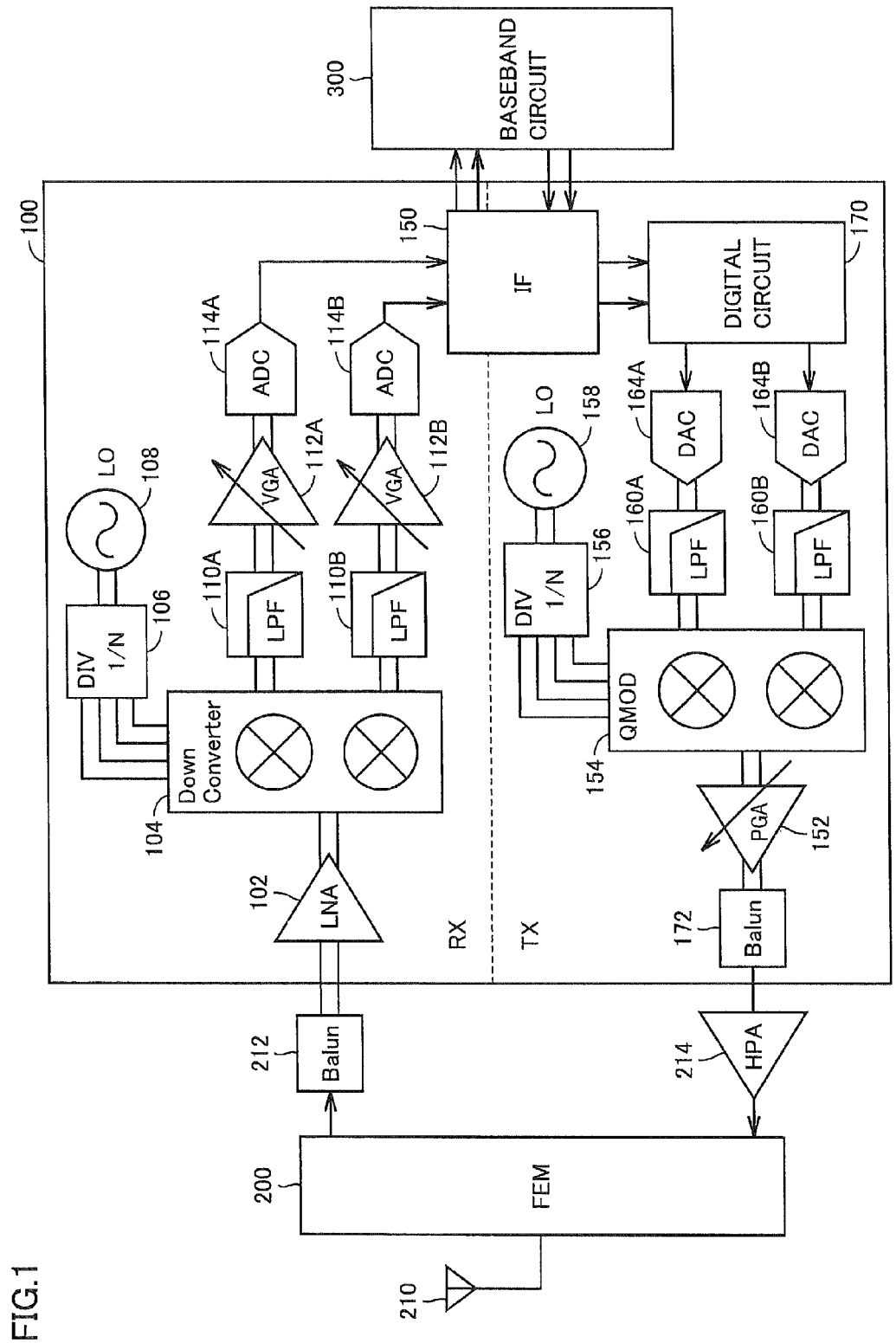
FIG. 1 is a block diagram showing a configuration of a semiconductor device according to an embodiment of the present invention.

The following describes the present invention in detail with reference to figures. It should be noted that in the figures, the same or corresponding portions are given the same reference characters and are not described repeatedly.

FIG. 1 is a block diagram showing a configuration of a semiconductor device according to an embodiment of the present invention. The semiconductor device shown in FIG. 1 includes: an RFIC (Radio-Frequency Integrated Circuit) 100 provided in a mobile phone or a data communication device; a baseband circuit 300; a HPA (High Power Amplifier) 214; a front end module (FEM) 200; an antenna 210; and a reception Balun (balance-to-unbalance transformer) 212.

Antenna 210 is used to transmit and receive a high-frequency signal (electric wave). Reception Balun 212 converts an unbalanced signal, which is received from antenna 210, into a balanced signal and provides it to RFIF 100. Meanwhile, HPA 214 amplifies an output signal from RFIC 100 and provides it to antenna 210.

RFIC 100 is a multimode transceiver IC (semiconductor integrated circuit for communication) and is formed as one chip. RFIC 100 is capable of transmitting and receiving an RF signal to and from a base station via antenna 210 in compliance with the following roughly five communication standards of transmission and reception methods: "GSM®/EDGE", "WCDMA", "HSPA", "HSPA+", and "LTE".

Here, the GSM® (Global System for Mobile Communication) is a communication standard of second generation (2G), which is implemented in accordance with an FDD (Frequency Division Duplex)-TDMA (Time Division Multiple Access) method. The GSM® employs a GMSK method as a digital modulation method. Meanwhile, the EDGE (Enhanced Data Rates for GSM Evolution) is an extended standard for packet communication in the GSM® method. In the EDGE, 8PSK (8 Phase Shift Keying) is employed as a digital modulation method.

The WCDMA (Wideband Code Divided Multiple Access) is a communication standard of third generation (3G) implemented by an FDD-CDMA (Code Division Multiple Access) method. In Europe and the United States, the WCDMA is known as UMTS (Universal Mobile Telecommunications Systems).

Each of the HSPA (High Speed Packet Access) and the HSPA+ is an extended standard for high-speed packet communication in the WCDMA, and is particularly called "communication standard of 3.5 generation (3.5G)".

The LTE (Long Term Evolution) is a communication standard for a mobile phone to achieve higher speed and wider band than those in the HSPA, and is called "communication standard of 3.9 generation (3.9G)". In the LTE, OFDMA (Orthogonal Frequency Division Multiple Access) is employed for downlink and SC-FDMA (Single Carrier Frequency Division Multiple Access) is employed for uplink.

As a configuration of a receiving device (RX), RFIC 100 includes: an LNA (Low-Noise Amplifier) 102; a Down Converter (frequency converter) 104; a local oscillator LO108; a divider 106 DIV; LPFs (Low Pass Filters) 110A, 110B; VGAs (Variable Gain Amplifiers) 112A, 112B that control reception power; and ADCs (Analog-to-Digital Converters) 114A, 114B. Outputs from ADCs 114A, 114B are provided to an interface (IF) 150 for digital RF.

Further, as a configuration of a transmitting device (TX), RFIC 100 includes: a digital circuit 170; DACs (Digital-to-Analog Converters) 164A, 164B; LPFs (Low Pass Filters) 160A, 160B; a local oscillator LO158; a divider 156DIV; a quadrature modulator QMOD 154; a PGA (Programmable Gain Amplifier) 152 that controls transmission power; and a transmission Balun 172 that converts a balanced signal into an unbalanced signal. An output from Balun 172 is provided to HPA 214.

For transmission and reception, the receiving device (RX) and the transmitting device (TX) simultaneously operate. During the operations, the output from the receiving device (RX) is provided to baseband circuit 300 via IF 150, whereas the output from baseband circuit 300 is provided to the transmitting device (TX) via IF 150.

IF 150 is an interface that connects RFIC 100 and baseband circuit 300 to each other, and is in compliance with an interface standard defined by the MIPI Alliance (MIPI: Mobile Industry Processor Interface).

Although not shown in the figures, RFIC 100 may include: a plurality of output terminals Tx1 to Txn, each of which outputs a transmission RF signal; and a plurality of input terminals Rx1 to Rxn, each of which receives a reception RF signal. In this case, the output terminals and the input terminals are in pairs such as (Tx1, Rx1), . . . , (Txn, Rxn). In accordance with a band (frequency band) used by RFIC 100, a pair of an output terminal and an input terminal to be used are determined.

Baseband circuit 300 performs digital demodulation and other signal processing to a digital reception baseband signal, which is received from RFIC 100, in accordance with the above-described five communication standards of transmission and reception methods so as to generate reception data (audio data, image data, or other data) from the digital reception baseband signal. Further, baseband circuit 300 performs digital modulation and other signal processing to transmission data (audio data, image data, or other data) in accordance with the above-described five communication standards of transmission and reception methods so as to generate a digital transmission baseband signal from the transmission data, and supplies the digital transmission baseband signal to RFIC 100. It should be noted that although not shown in FIG. 1, a mobile phone including the semiconductor device according to the present embodiment includes an application processor, a memory, a speaker, a microphone, an input key, and a liquid crystal monitor, each of which sends and receives a signal to and from baseband circuit 300.

Figure 2:
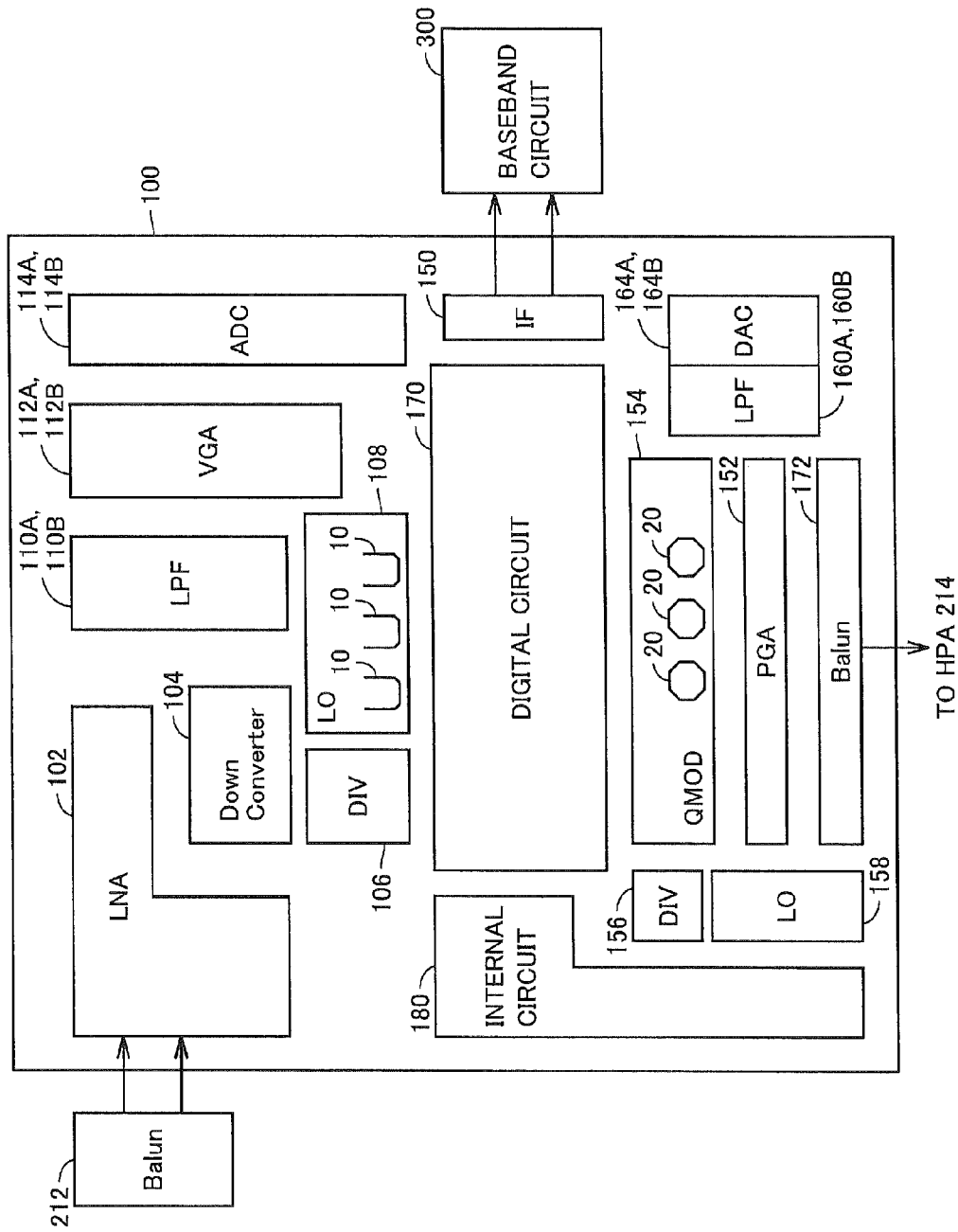
FIG. 2 shows an arrangement (layout) of a group of circuits included in the semiconductor device according to the present embodiment.

FIG. 2 shows an arrangement (layout) of a group of circuits included in the semiconductor device according to the present embodiment. Referring to FIG. 2, in an overview, horseshoe-shaped inductors 10 included in LO108 and spiral-shaped inductors 20 included in the QMOD are arranged in the following arrangement relation: a distance becomes minimum between a current path P2 (see FIG. 4) of current paths P1 to P3 (see FIG. 4) in a horseshoe-shaped inductor and a spiral-shaped inductor 20 with the digital circuit interposed therebetween. It should be noted that in FIG. 1, the number of spiral-shaped inductors 20, which correspond to horseshoe-shaped inductors 10, are the same as the number of horseshoe-shaped inductors 10, but the present invention is not limited to this. It should be also noted that the term "horseshoe-shaped" herein is intended to include a shape of horse's hoof and a substantially U-shape.

Moreover, the semiconductor device according to the present embodiment further includes an internal circuit 180 in addition to the circuits shown in FIG. 1. Internal circuit 180 includes a circuit concerned with other communication methods (such as GSM® method) or the like.

The following describes the arrangement relation between horseshoe-shaped inductor 10 and spiral-shaped inductor 20 in FIG. 2 more in detail.

Figure 3:
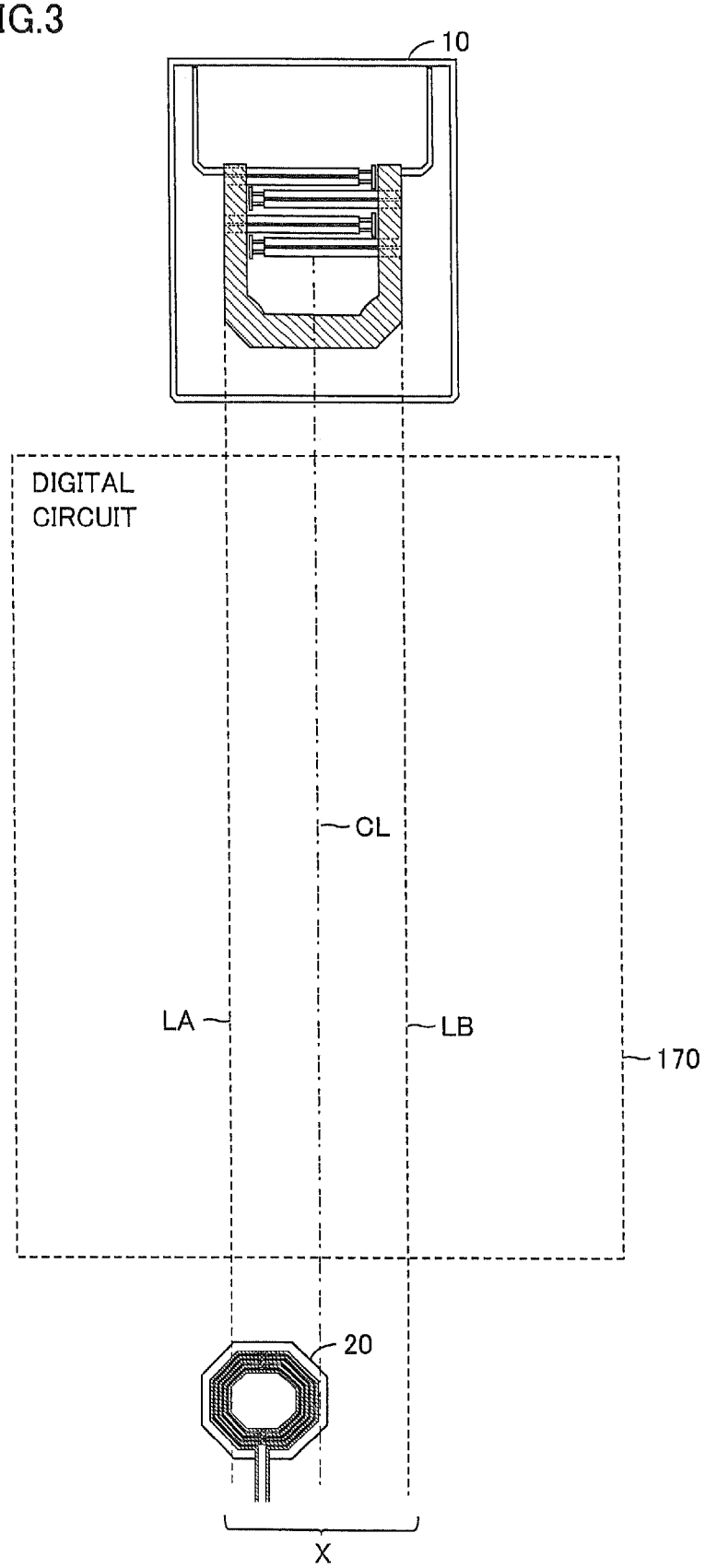
FIG. 3 is an enlarged view of a part of the arrangement (layout) of the circuits of the semiconductor device.

FIG. 3 is an enlarged view of a part of the arrangement (layout) of the circuits of the semiconductor device. Referring to FIG. 3, horseshoe-shaped inductor 10 and spiral-shaped inductor 20 are arranged to face each other. Arranged between horseshoe-shaped inductor 10 and spiral-shaped inductor 20 is digital circuit 170, which is strong against noise. If an analog circuit weak against noise is arranged in the location of digital circuit 170, magnetic field generated by horseshoe-shaped inductor 10 leads to a noise signal in the analog circuit, thus presumably compromising stability of the system.

Regarding the physical positional relation between horseshoe-shaped inductor 10 and spiral-shaped inductor 20, when horseshoe-shaped inductor 10 has a line-symmetric configuration, the center of spiral-shaped inductor 20 is preferably disposed on symmetry axis CL thereof. However, the present invention is not limited to this. Spiral-shaped inductor 20 is arranged such that at least a portion of spiral-shaped inductor 20 overlaps with a region X in which a trajectory of horseshoe-shaped inductor 10 is formed when horseshoe-shaped inductor 10 is moved in parallel with a direction perpendicular to current path P2 (see FIG. 4) of horseshoe-shaped inductor 10.

With the above-described arrangement, magnetic field passing through spiral-shaped inductor 20 does not become unbalance depending on current flowing in horseshoe-shaped inductor 10, thereby reducing leakage of the common mode of the signal from local oscillator 108 of the receiving device (RX) to spiral-shaped inductor 20. This leads to reduction of unnecessary wave.

The following describes a specific configuration of horseshoe-shaped inductor 10.

Figure 4:
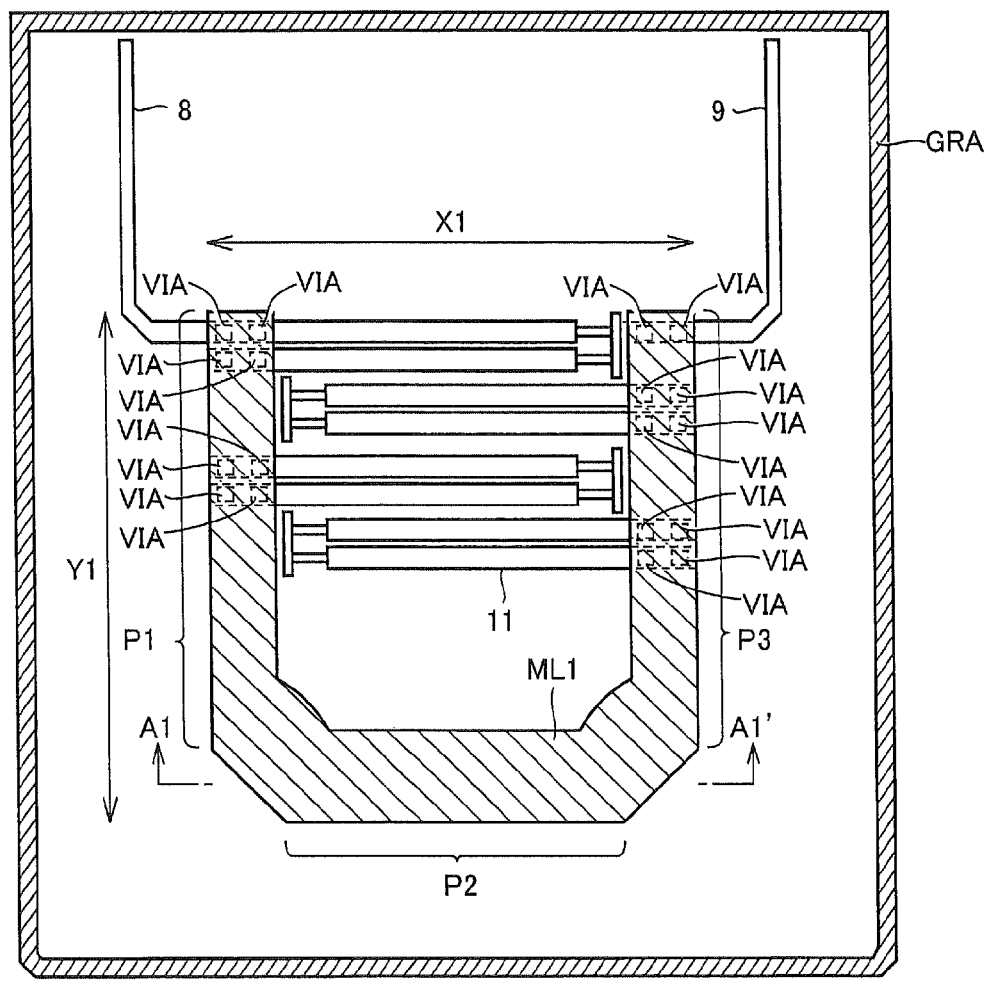
FIG. 4 is a layout diagram showing a horseshoe-shaped inductor 10.
Figure 5:
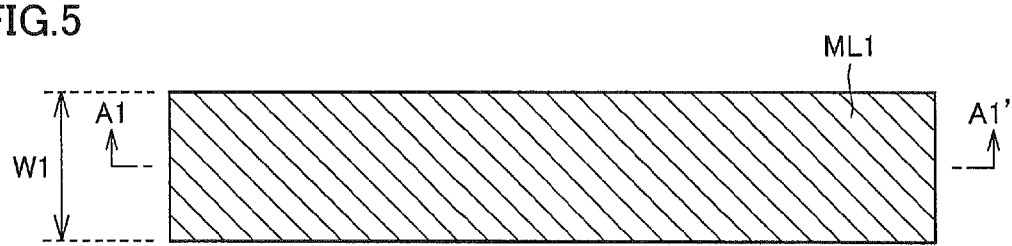
FIG. 5 is a cross sectional view taken along a line A1-A1' in FIG. 4.

FIG. 4 is a layout diagram showing horseshoe-shaped inductor 10. FIG. 5 is a cross sectional view taken along a line A1-A1' FIG. 4. Referring to FIG. 4 and FIG. 5, horseshoe-shaped inductor 10 is composed of one end 8 and the other end 9 for connection with another circuit, and a metal wire ML1. Horseshoe-shaped inductor 10 includes an inductor having current paths P1 to P3 each having a linear shape, a capacitor 11, and a plurality of contacts VIA. Horseshoe-shaped inductor 10 operates in a manner equivalent to a so-called LC oscillation circuit. In this horseshoe-shaped inductor 10, a current of up to approximately 10 mA flows.

Further, length X1 and length Y1 of horseshoe-shaped inductor 10 in the X axial direction and Y axial direction are illustrated. Length X1 represents the length of an opening. In actual manufacturing, length X1 and length Y1 are preferably substantially the same. Further, inductance property can be adjusted by adjusting length Y1.

It should be noted that a guard ring region GRA is provided by adding an impurity into the semiconductor substrate or by using metal wire ML1. Guard ring region GRA is arranged to surround horseshoe-shaped inductor 10 when viewed in a plan view. Even in the case where such a guard ring region GRA is provided, unnecessary wave cannot be reduced only with guard ring region GRA because the width of metal wire ML1 of horseshoe-shaped inductor 10 is larger than guard ring region GRA. Hence, even in such a case, the arrangement in the embodiment of the present application can lead to further reduction of unnecessary wave.

The opening is formed by one end of current path P1 and one end of current path P3. The other end of current path P1 and one end of current path P2 are connected to each other. The other end of current path P2 and the other end of current path P3 are connected to each other.

Further, capacitor 11 is formed of a lower layer disposed below metal wire ML1, which is configured as an uppermost wire layer. Current paths P1 to P3 are formed only of metal wire ML1, and are the same as a below-described wire layer that forms spiral-shaped inductor 20.

Figure 6:
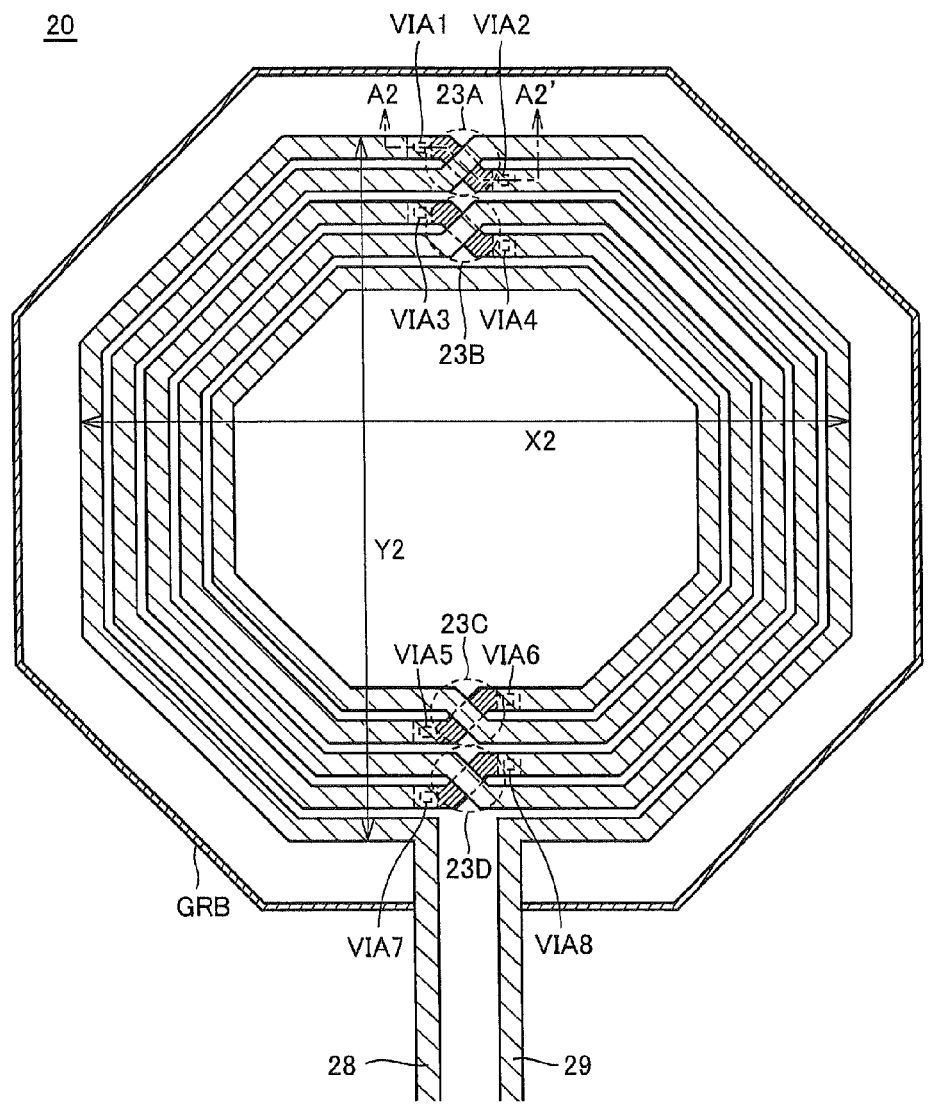
FIG. 6 shows a planar shape of a spiral-shaped inductor 20.
Figure 7:
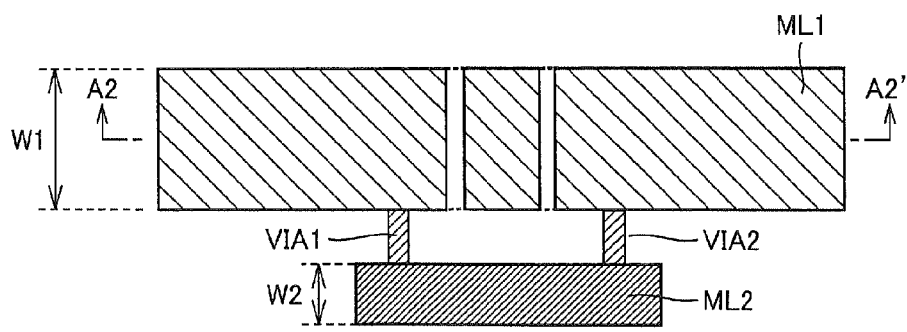
FIG. 7 is a cross sectional view taken along a line A2-A2' in FIG. 6.

FIG. 6 shows a planar shape of spiral-shaped inductor 20. FIG. 7 is a cross sectional view taken along a line A2-A2' in FIG. 6. Referring to FIG. 6 and FIG. 7, a winding wire of spiral-shaped inductor 20 specifically includes: a metal wire ML1 serving as an upper layer; a metal wire ML2 serving as a lower layer that forms a winding wire portion extending below metal wire ML1; and contacts VIA1 to VIA8 used to connect metal wire ML1 and metal wire ML2 to each other. Metal wire ML1 and metal wire ML2 are electrically insulated by an insulating layer.

The winding wire of spiral-shaped inductor 20 is wound by five times. Between one end 28 and the other end 29, the winding wire includes four crossing portions 23A to 23D at which the winding wire crosses over itself, three-dimensionally.

Further, length X2 and length Y2 of the outermost portions of the winding wire of spiral-shaped inductor 20 in the X axial direction and the Y axial direction are illustrated. It should be noted that horseshoe-shaped inductor 10 and spiral-shaped inductor 20 are preferably employed to satisfy the following relations: length X1>length X2 and length Y1>length Y2.

Further, as shown in FIG. 7, a winding wire portion extending at the upper side in crossing portion 23A is composed of metal wire ML1 whereas a winding wire portion extending at the lower side in crossing portion 23A is composed of only metal wire ML2. Hence, the winding wire portions are composed of metal wires ML1, ML2 connected to each other by contacts VIA1, VIA2. Likewise, each of crossing portions 23B to 23D has the same configuration as that of crossing portion 23A described above.

Moreover, a guard ring region GRB is provided by adding an impurity into the semiconductor substrate or by using metal wire ML1. Guard ring region GRB is arranged to surround spiral-shaped inductor 20 when viewed in a plan view.

It should be noted that metal wire ML1 of horseshoe-shaped inductor 10 shown in FIG. 4 and metal wire ML1 of spiral-shaped inductor 20 shown in FIG. 6 are preferably formed in the same wire layer processing step and are preferably the uppermost wire layers in the semiconductor device according to the present embodiment because such a configuration allows for control to minimize an influence of unnecessary wave generated in the other wire layer.

Further, an orientation of spiral-shaped inductor 20 relative to horseshoe-shaped inductor 10 may be set arbitrarily. In other words, in the present embodiment, the location of horseshoe-shaped inductor 10 arranged is important and the orientation of spiral-shaped inductor 20 relative to horseshoe-shaped inductor 10 can be determined arbitrarily. Further, spiral-shaped inductor 20 has been illustrated herein, but an inductor having a shape other than the spiral shape may be employed. A distance between horseshoe-shaped inductor 10 and spiral-shaped inductor 20 is preferably approximately six times as large as length Y1 of horseshoe-shaped inductor 10 shown in FIG. 4.

Here, an equivalent circuit of horseshoe-shaped inductor 10 will be described before describing an operation of the semiconductor device of the present embodiment.

Figure 8:
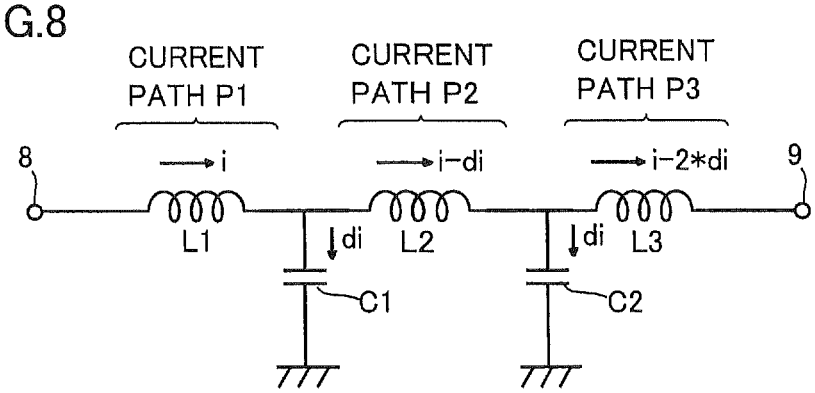
FIG. 8 shows an equivalent circuit of horseshoe-shaped inductor 10.

FIG. 8 shows the equivalent circuit of horseshoe-shaped inductor 10. Referring to FIG. 8, this equivalent circuit includes: inductors L1, L2, L3 corresponding to current paths P1 to P3; and capacitors C1, C2 corresponding to capacitor 11. Inductors L1 to L3 are connected in series, and are provided between one end 8 and the other end 9. Capacitor C1 is provided between the ground and a connection node of inductor L1 and inductor L2. Further, capacitor C2 is provided between the ground and a connection node of inductor L2 and inductor L3.

When supplying current from one end 8 to the other end 9, it is assumed that current i flows in current path P1, for example. When flowing in each of current paths P2, P3, current i is reduced by a current di due to attenuation resulting from parasitic capacitance or the like in each of the current paths. In other words, current i-di, which is smaller than that in current path P1 by current di flowing in capacitor C1, flows in current path P2. Further, current i-2*di, which is smaller than that in current path P2 by current di flowing in capacitor C2, flows in current path P3. It should be noted that the symbol "*" represents multiplication.

Thus, the currents flowing in current paths P1 to P3 are different from one another. Hence, magnetic fields induced by these currents are different from one another. In spiral-shaped inductor 20, different induction currents are generated due to the different induced magnetic fields.

Figure 9:
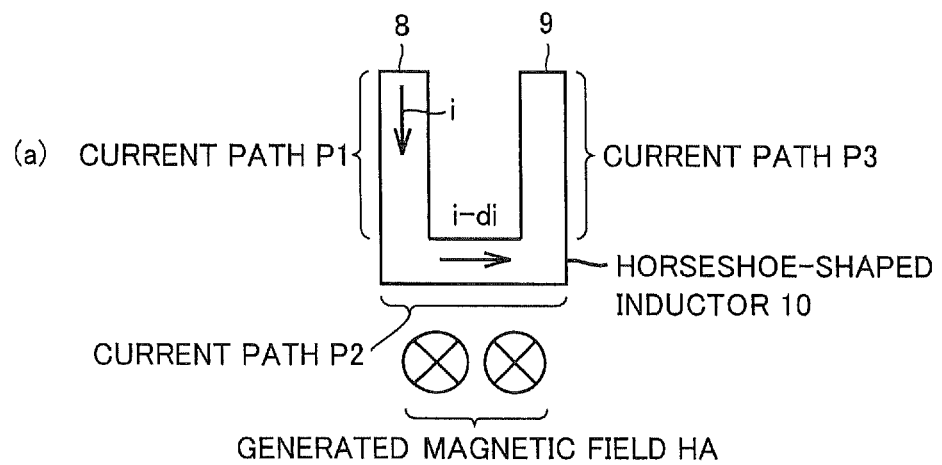
FIG. 9 is a schematic view for illustrating an operation of the semiconductor device of the present embodiment.
Figure 9:
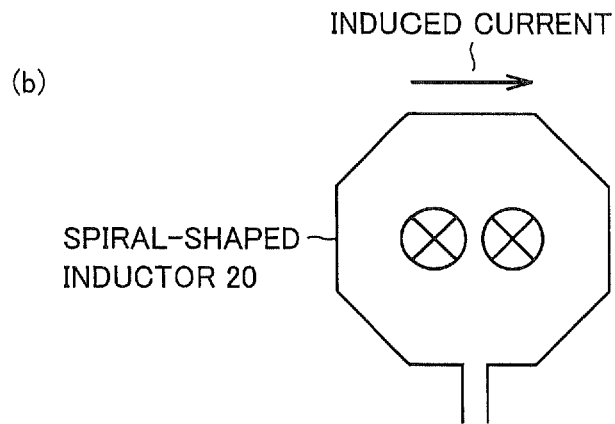

FIG. 9 is a schematic view for illustrating an operation of semiconductor device of the present embodiment. As described above, in the semiconductor device of the present embodiment, current path P2 of horseshoe-shaped inductor 10 and spiral-shaped inductor 20 are arranged to be proximate to each other as compared with the other current paths P1, P3.

Referring to FIG. 9, as illustrated in FIG. 8, when current i flows in current path P1, current i-di flowing in current path P2 causes generation of magnetic field HA during supply of current from one end 8 to the other end 9 via current paths P1 to P3 in horseshoe-shaped inductor 10. The direction of magnetic field HA is a direction from the front side of a plane of sheet toward the back side thereof. The direction of magnetic field HA is perpendicular to the plane of sheet. On this occasion, magnetic fluxes of magnetic field HA passing through the inside of spiral-shaped inductor 20 induce current clockwisely on spiral-shaped inductor 20.

Figure 10:
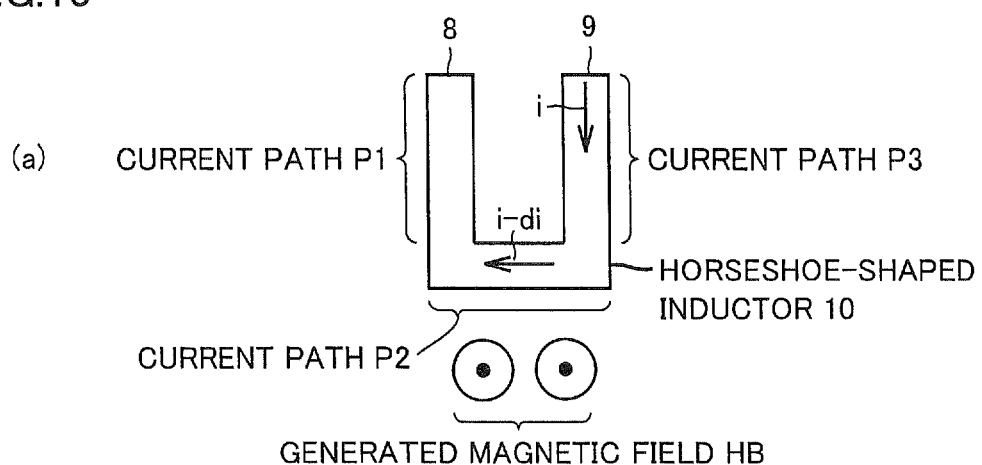
FIG. 10 is a schematic view for illustrating an operation of the semiconductor device of the present embodiment (when current flows in a direction opposite to that in FIG. 9).
Figure 10:
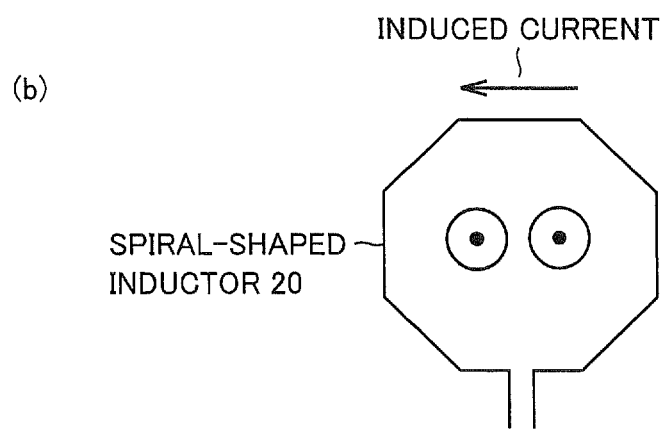

The following describes a case where current is supplied in a direction opposite to the direction in which the current is supplied as shown in FIG. 9. FIG. 10 is a schematic view for illustrating an operation of the semiconductor device of the present embodiment (when the current flows in the direction opposite to that in FIG. 9). Referring to FIG. 10, the direction of the current flowing in current path P2 is different but the magnitude thereof is the same. Hence, the direction of generated magnetic field HB is a direction from the back side of the plane of sheet toward the front side thereof, but the magnitude of magnetic field HB is the same. On this occasion, magnetic fluxes of magnetic field HB passing through the inside of spiral-shaped inductor 20 induce current counter-clockwisely on spiral-shaped inductor 20.

As shown in FIG. 9 and FIG. 10, by arranging current path P2 of horseshoe-shaped inductor 10 and spiral-shaped inductor 20 such that they are proximate to each other in the semiconductor device according to the present embodiment, the currents induced in spiral-shaped inductor 20 are different in directions but are the same in magnitude. Accordingly, generation of unnecessary wave due to the common mode can be reduced.

In other words, magnetic field passing through spiral-shaped inductor 20 does not become unbalanced depending on a direction of current flowing in horseshoe-shaped inductor 10, thereby reducing generation of unnecessary wave due to leakage of the common mode of the signal from local oscillator 108 of the receiving device (RX) to spiral-shaped inductor 20.

Reference Example

The following describes a reference example having the same configuration as that of the semiconductor device of the present embodiment and different in arrangement therefrom. For example, current path P3 of horseshoe-shaped inductor 10 and spiral-shaped inductor 20 are arranged to be proximate to each other.

Figure 11:
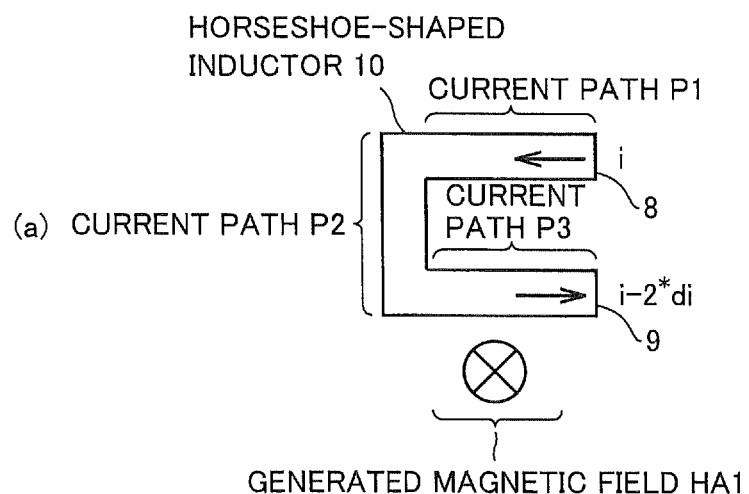
FIG. 11 is a schematic view for illustrating an operation of a semiconductor device of a reference example.
Figure 11:
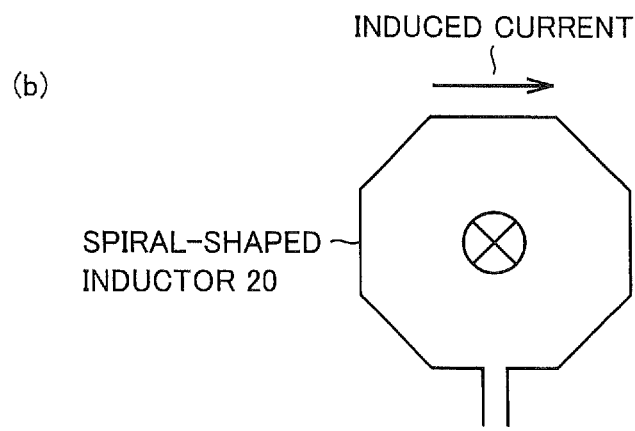
Figure 12:
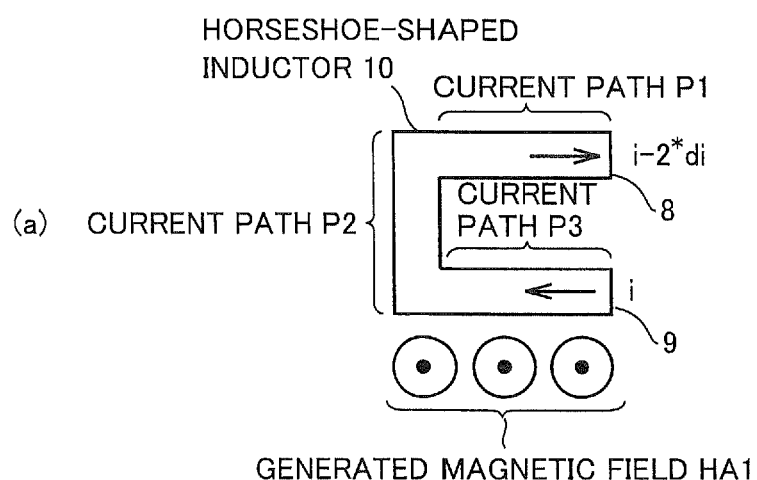
FIG. 12 is a schematic view for illustrating an operation of the semiconductor device of the reference example (when current flows in a direction opposite to that in FIG. 11).
Figure 12:
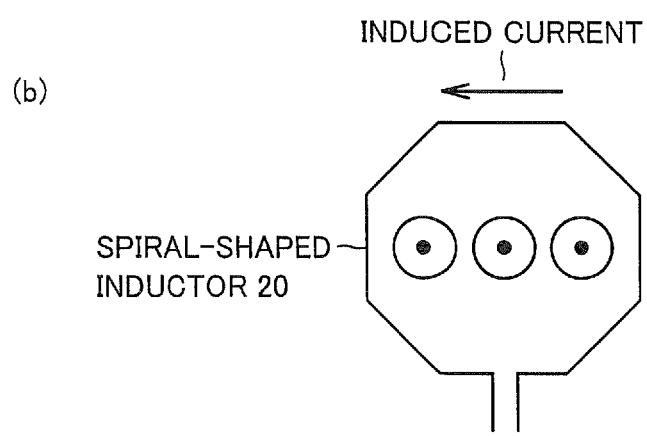

FIG. 11 is a schematic view for illustrating an operation of the semiconductor device of the reference example. Further, FIG. 12 is a schematic view for illustrating an operation of the semiconductor device of the reference example (when the current flows in a direction opposite to that in FIG. 11). Referring to FIG. 11, magnetic field HA1 passing through the inside of spiral-shaped inductor 20 is generated by current i flowing in current path P3. On the other hand, referring to FIG. 12, magnetic field HB1 passing through the inside of spiral-shaped inductor 20 is generated by current i-2*di flowing in current path P3. Thus, as with the embodiment, the directions of the magnetic fluxes passing through the inside of spiral-shaped inductor 20 of this reference example are opposite to each other. However, the magnitude of magnetic field becomes varied as compared with that in the embodiment to fall in an unbalanced state.

Specifically, as described above, the magnitude of magnetic field passing through the inside of spiral-shaped inductor 20 is varied depending on a direction of current, with the result that the magnitude of current induced by the magnetic field differs.

Accordingly, when horseshoe-shaped inductor 10 and spiral-shaped inductor 20 are arranged in the manner shown in the reference example, the magnetic field passing through spiral-shaped inductor 20 becomes unbalanced depending on a direction of current flowing in horseshoe-shaped inductor 10, thus resulting in increase of leakage of the common mode of the signal from local oscillator 108 of receiving device (RX) to spiral-shaped inductor 20. This leads to increase of generation of unnecessary wave.

In contrast to the reference example, in the present embodiment, the magnetic field passing through spiral-shaped inductor 20 does not become unbalanced depending on a direction of current flowing in horseshoe-shaped inductor 10, thereby reducing the unnecessary wave resulting from the leakage of the common mode of the signal from local oscillator 108 of the receiving device (RX) to spiral-shaped inductor 20. It should be noted that horseshoe-shaped inductor 10 is arranged as shown in FIG. 11 and FIG. 12 as the reference example, but this is just exemplary and is not restrictive.

Finally, the embodiment will be summarized as follows with reference to the figures and the like.

As shown in FIG. 2 and FIG. 3, a semiconductor device of the embodiment includes: a spiral-shaped inductor 20 formed to include a first conductor layer (metal wire ML1); and a horseshoe-shaped inductor 10 formed to include the first conductor layer (metal wire ML1), horseshoe-shaped inductor 10 being arranged such that an opening of horseshoe-shaped inductor 10 is disposed opposite to spiral-shaped inductor 20.

Preferably, horseshoe-shaped inductor 10 includes current paths P1 to P3 each having a linear shape, the opening is faulted by one end of current path P1 and one end of current path P3, the other end of current path P1 and one end of current path P2 are connected to each other and the other end of current path P3 and the other end of current path P2 are connected to each other, and horseshoe-shaped inductor 10 is arranged in a direction such that a distance between spiral-shaped inductor 20 and current path P2 becomes minimum among distances between spiral-shaped inductor 20 and current paths P1 to P3.

Further preferably, spiral-shaped inductor 20 is arranged such that at least a portion of spiral-shaped inductor 20 overlaps with a region in which a trajectory of horseshoe-shaped inductor 10 is formed when horseshoe-shaped inductor 10 is moved in parallel with a direction perpendicular to current path P2.

Further preferably, horseshoe-shaped inductor 10 is line-symmetric, and a center of spiral-shaped inductor 20 is disposed on a symmetry axis of the line symmetry.

Preferably, the semiconductor device is a semiconductor device that performs a transmission/reception process using a radio wave, spiral-shaped inductor 20 is provided in a quadrature modulator QMOD of a transmitting side, and horseshoe-shaped inductor 10 is provided in a local oscillator LO108 of a receiving side.

Moreover, preferably, the semiconductor device further includes a digital circuit 170 arranged between spiral-shaped inductor 20 and horseshoe-shaped inductor 10.

Heretofore, the invention made by the present inventor has been specifically described based on the embodiment. However, the present invention should not be limited to the embodiment and can be modified in a various manner so as not to deviate from gist thereof.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a first inductor comprising a first conductor layer and having a spiral shape;
   a second inductor comprising said first conductor layer and having a horseshoe shape, said second inductor being arranged such that an opening of said second inductor is disposed opposite to said first inductor; and
   a digital circuit arranged between the first and second inductors,
   wherein the semiconductor device performs a transmission/reception process using a radio wave, the first inductor is provided in a quadrature modulator of a transmitting side, and the second inductor is provided in a local oscillator of a receiving side.

2. The semiconductor device according to claim 1, wherein
   said second inductor includes first to third current paths each having a linear shape,
   said opening is formed by one end of said first current path and one end of said third current path,
   the other end of said first current path and one end of said second current path are connected to each other and the other end of said third current path and the other end of said second current path are connected to each other, and
   said second inductor is arranged in a direction such that a distance between said first inductor and said second current path becomes minimum among distances between said first inductor and said first to third current paths.

3. The semiconductor device according to claim 2, wherein said first inductor is arranged such that at least a portion of said first inductor overlaps with a region in which a trajectory of said second inductor is formed when said second inductor is moved in parallel with a direction perpendicular to said second current path.

4. The semiconductor device according to claim 3, wherein
   said second inductor is line-symmetric, and
   a center of said first inductor is disposed on a symmetry axis of the line-symmetric second inductor.

5. The semiconductor device according to claim 1, wherein the first inductor comprises a plurality of first inductors and the second inductor comprises a plurality of second inductors, and a number of the plurality of first inductors is equal to a number of the plurality of second inductors.

6. The semiconductor device according to claim 1, wherein the first inductor has a length in a first direction and a length in a second direction perpendicular to the first direction, and the second inductor has a length in the first direction and a length in the second direction, and the length of the second inductor in the first direction is greater than the length of the first inductor in the first direction, and the length of the second inductor in the second direction is greater than the length of the first inductor in the second direction.

7. The semiconductor device according to claim 1, wherein the second inductor is symmetric about a symmetry axis, and comprises first and second current paths formed in a direction which is parallel to the symmetry axis, and a third current path which connects the first and second current paths.

8. The semiconductor device according to claim 7, wherein the opening is formed between an end of the first current path and an end of the second current path.

9. The semiconductor device according to claim 1, wherein the second inductor further comprises a capacitor formed in a layer which is beneath the first conductor layer.

10. The semiconductor device according to claim 1, wherein the first conductor layer comprises an uppermost layer of the first inductor, and the first inductor comprises:
    a second conductor layer formed beneath the first conductor layer; and
    a plurality of contacts which connect the first and second conductor layers.

11. The semiconductor device according to claim 10, wherein the first inductor comprises a winding wire including the first and second conductor layers, the winding wire being wound a plurality of times and including a plurality of crossing portions at which a portion of the winding wire crosses over another portion of the winding wire.

12. The semiconductor device according to claim 1, wherein the first conductor layer comprises an uppermost wiring layer of the semiconductor device.

13. The semiconductor device according to claim 1, wherein a distance between the first and second inductors is greater than a length of the second inductor.

14. A semiconductor device, comprising:
a first inductor comprising:
  a first conductor layer;
  a second conductor layer formed beneath the first conductor layer; and
  a plurality of contacts which connect the first and second conductor layers;
a second inductor including a substantially U-shaped portion of the first conductor layer, the U-shaped portion being symmetric about a symmetry axis and including first and second current paths formed in a direction which is parallel to the symmetry axis, an opening being formed between an end of the first current path and an end of the second current path which are opposite to the first inductor; and
a digital circuit arranged between the first and second inductors,
wherein the semiconductor device performs a transmission/reception process using a radio wave, the first inductor is provided in a quadrature modulator of a transmitting side, and the second inductor is provided in a local oscillator of a receiving side.

* * * * *